(12) United States Patent
Wakaoka et al.

(10) Patent No.: US 11,277,940 B2
(45) Date of Patent: Mar. 15, 2022

(54) VAPOR CHAMBER

(71) Applicant: Murata Manufacturing Co., Ltd., Nagaokakyo (JP)

(72) Inventors: Takuo Wakaoka, Nagaokakyo (JP); Norikazu Kume, Nagaokakyo (JP); Haruhiko Ikeda, Nagaokakyo (JP); Tatsuhiro Numoto, Nagaokakyo (JP); Atsushi Kishimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 158 days.

(21) Appl. No.: 16/598,090

(22) Filed: Oct. 10, 2019

(65) Prior Publication Data

US 2020/0045848 A1 Feb. 6, 2020

Related U.S. Application Data

(63) Continuation of application No. PCT/JP2018/016938, filed on Apr. 26, 2018, and a continuation of application No. PCT/JP2017/017079, filed on Apr. 28, 2017.

(30) Foreign Application Priority Data

Apr. 28, 2017 (WO) .................. PCT/JP2017/017079

(51) Int. Cl.
*H05K 7/20* (2006.01)
*F28D 15/04* (2006.01)
*H01L 23/427* (2006.01)

(52) U.S. Cl.
CPC ....... *H05K 7/20336* (2013.01); *F28D 15/046* (2013.01); *H01L 23/427* (2013.01)

(58) Field of Classification Search
CPC ... H05K 7/20336; F28D 15/046; F28D 15/04; F28D 15/043; F28D 2015/0216; F28D 15/02; F28D 15/0266; H01L 23/427
USPC ......... 165/104.26, 104.21, 104.22, DIG. 531
See application file for complete search history.

(56) References Cited

U.S. PATENT DOCUMENTS

| 10,246,223 | B2 | 4/2019 | Kessler | |
| 2004/0112450 | A1* | 6/2004 | Hsu | F28D 15/046 138/38 |
| 2004/0244951 | A1* | 12/2004 | Dussinger | B22F 3/11 165/104.26 |

(Continued)

FOREIGN PATENT DOCUMENTS

| JP | S5535894 A | | 3/1980 |
| JP | S5687795 A | * | 7/1981 |

(Continued)

OTHER PUBLICATIONS

International Search Report issued in PCT/JP2018/016938, dated Jul. 31, 2018.

(Continued)

*Primary Examiner* — Justin M Jonaitis
(74) *Attorney, Agent, or Firm* — Arent Fox LLP (57) ABSTRACT

A vapor chamber that includes a housing, a wick structure joined to a major inside surface of the housing, and a working liquid enclosed inside the housing. The wick structure is joined to the housing at a joint portion within a joint (Continued)

region, and a proportion of a total area of the joint portion within the joint region to an area of the joint region is 50% or less.

18 Claims, 7 Drawing Sheets

(56) References Cited

U.S. PATENT DOCUMENTS

| | | | | |
|---|---|---|---|---|
| 2006/0098411 | A1* | 5/2006 | Lee | F28D 15/046 361/704 |
| 2006/0124280 | A1* | 6/2006 | Lee | H01L 23/467 165/104.26 |
| 2007/0025085 | A1* | 2/2007 | Chang | F28D 15/0233 361/704 |
| 2007/0272399 | A1* | 11/2007 | Nitta | F28D 15/046 165/185 |
| 2007/0294892 | A1* | 12/2007 | Yang | F28D 15/046 29/890.032 |
| 2007/0295494 | A1* | 12/2007 | Mayer | F28D 15/046 165/104.26 |
| 2011/0127013 | A1 | 6/2011 | Kawamura et al. | |
| 2013/0137322 | A1* | 5/2013 | Watanabe | H01B 7/428 442/38 |
| 2016/0031604 | A1 | 2/2016 | Kessler | |
| 2016/0128234 | A1* | 5/2016 | Uesugi | H01L 23/427 361/700 |
| 2019/0075682 | A1* | 3/2019 | Shioga | F28D 15/02 |

FOREIGN PATENT DOCUMENTS

| | | |
|---|---|---|
| JP | S5687795 A | 7/1981 |
| JP | S57188986 A | 11/1982 |
| JP | 2001208489 A | 8/2001 |
| JP | 2001339026 A | 12/2001 |
| JP | 2004028442 A | 1/2004 |
| JP | 2004238672 A | 8/2004 |
| JP | 2008045820 A | 2/2008 |
| JP | 2011112330 A | 6/2011 |
| JP | 2014109401 A | 6/2014 |
| JP | 2015010765 A | 1/2015 |
| JP | 2016050713 A | 4/2016 |
| WO | 2012029560 A1 | 3/2012 |

OTHER PUBLICATIONS

Written Opinion of the International Searching Authority issued in PCT/JP2018/016938, dated Jul. 31, 2018.
International Search Report issued in PCT/JP2017/017079, dated Aug. 1, 2017.
Written Opinion of the International Searching Authority issued in PCT/JP2017/017079, dated Aug. 1, 2017.

* cited by examiner

VAPOR CHAMBER

CROSS REFERENCE TO RELATED APPLICATIONS

The present application is a continuation of International application No. PCT/JP2017/017079, filed Apr. 28, 2017, and a continuation of International application No. PCT/JP2018/016938, filed Apr. 26, 2018, the entire contents of each of which are incorporated herein by reference.

FIELD OF THE INVENTION

The present invention relates to a vapor chamber.

BACKGROUND OF THE INVENTION

In recent years, an amount of heat emitted by a microelectronics device has tended to increase due to high degree of integration and demand for high performance. Meanwhile, a product has become smaller in size, which causes heat generation density to increase. Dissipating heat has become an important issue. This situation is found especially in the field of mobile terminals, such as smartphones and tablet devices. In recent years, a graphite sheet or the like has been often adopted as a heat dissipating member. However, the heat transport capacity of the graphite sheet is not large enough. Accordingly, application of various other heat dissipating members, in particular, use of a vapor chamber has been studied. The vapor chamber is a tabular shaped heat pipe that can transport heat very efficiently.

The vapor chamber has a structure that includes a housing in which a working liquid is enclosed and a wick structure is disposed. The wick structure transports the working liquid by using capillary forces. The working liquid absorbs heat and evaporates at an evaporation section of the vapor chamber that receives heat from a device that generates the heat. The working liquid that has evaporated moves within the vapor chamber to a condensation section where the working liquid is cooled and returns to a liquid phase. The working liquid after returning to the liquid phase moves toward the device that generates heat (i.e., toward the evaporation section) due to the capillary forces of the wick structure and thereby cools the device. By repeating this process self-supportedly without using external power, the vapor chamber can quickly dissipate heat two-dimensionally by utilizing the latent heat of vaporization and condensation of the working liquid.

Patent Document 1 discloses a panel-shaped heat pipe as a type of the vapor chamber described above, in which a wick structure is disposed inside a panel-shaped container and a working liquid is enclosed therein at a reduced pressure. More specifically, Patent Document 1 discloses the panel-shaped heat pipe in which a wick structure made of an aluminum alloy is soldered to a main body made of aluminum.

Patent Document 1: Japanese Unexamined Patent Application Publication No. 2004-28442.

SUMMARY OF THE INVENTION

Since products equipped with the vapor chamber have tended to generate an increased amount of heat in recent years, the panel-shaped heat pipe according to Patent Document 1 may not provide a sufficient heat transport capacity.

An object of the present invention is to provide a vapor chamber that has an excellent heat transport capacity and is advantageous in weight reduction.

The inventors have found that in the case of joining a wick structure to the housing, if only part of surface of the wick structure is joined to the housing instead of joining the entire surface of the wick structure, the space between the wick structure and the housing becomes available for retaining and transporting the working liquid, and accordingly a vapor chamber that is excellent in heat transport capacity can be obtained. The vapor chamber may be obtained by joining the wick structure to the housing in a spot joining manner. In this case, however, if an entire spot joining region is joined to the housing, the joining region cannot contribute to retention and transport of the working liquid. The inventors have found that by joining only part of the joint region instead of joining the entire joint region, the rest of the joint region can contribute to retention and transport of the working liquid and thereby improves the heat transport capacity. The present invention has been made on the basis of this knowledge.

According to a first aspect of the present invention, a vapor chamber includes a tabular shaped housing, a wick structure joined to a major inside surface of the housing, and a working liquid enclosed inside the housing. The wick structure is joined to the housing at a joint portion within a joint region, and a proportion of total area of the joint portion within the joint region to an area of the joint region is 50% or less.

According to a second aspect of the present invention, a heat radiation device includes the above-described vapor chamber.

According to a third aspect of the present invention, an electronic device includes the above-described vapor chamber or the above-described heat radiation device.

According to the present invention, the wick structure is joined to the major inside surface of the housing by joining part of the surface of the wick structure to the housing, which enables the heat transport capacity to increase.

DETAILED DESCRIPTION OF THE PREFERRED EMBODIMENTS

A vapor chamber according to the present invention will be described in detail with reference to the drawings.

Figure 1:
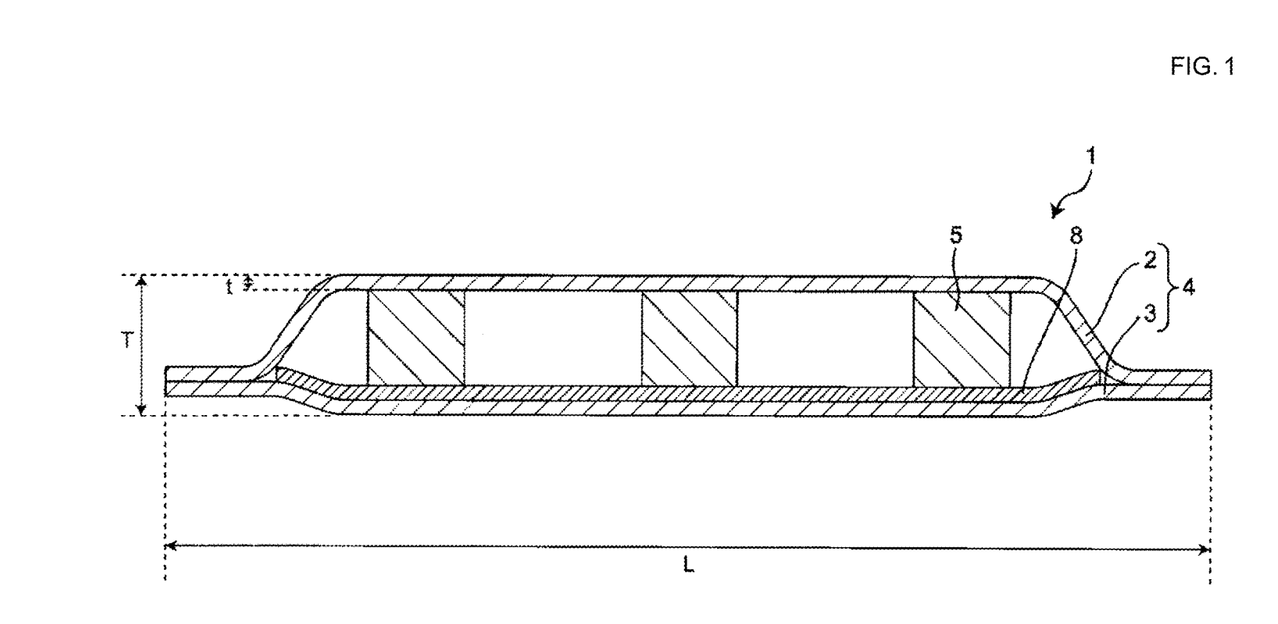
FIG. 1 is a schematic cross section of vapor chamber 1 according to an embodiment of the present invention.
Figure 2:
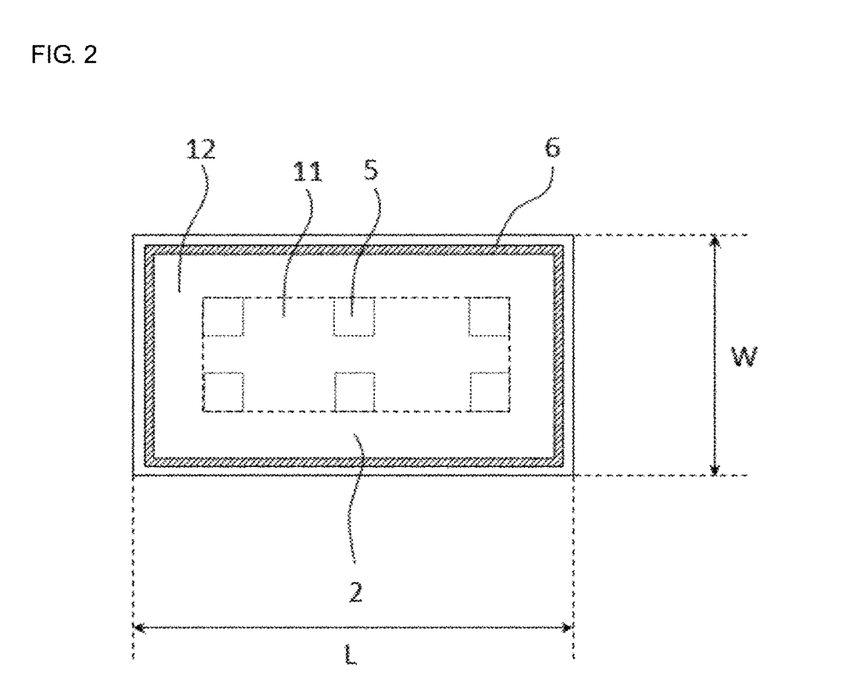
FIG. 2 is a schematic plan view of the vapor chamber 1 according to the embodiment of the present invention as viewed perpendicular to a first sheet.

As illustrated in FIGS. 1 and 2, a vapor chamber 1 according to the present embodiment includes a housing 4 constituted by a first sheet 2 and a second sheet 3 that oppose each other. The vapor chamber 1 also includes a working liquid (not illustrated) enclosed in the housing 4. Multiple pillars 5 are disposed between the first sheet 2 and the second sheet 3 so as to support the first sheet 2 and the second sheet 3 from an inside of the housing 4, thereby forming an internal space in the housing 4. When pillars 5 located near the edges of the first sheet 2 and the second sheet 3 are connected by straight lines, an inside region defined by the straight lines is a region 11 (hereinafter called a "central region"). In the central region 11, the first sheet 2 and the second sheet 3 are spaced from each other at a predetermined distance by the pillars 5 that support the first sheet 2 and the second sheet 3. A region outside the central region 11 is a region 12 (hereinafter otherwise called an "end region"). The first sheet 2 and the second sheet 3 come into contact with each other and are joined and sealed together at a peripheral portion in the end region 12. A portion at which the first sheet and the second sheet are joined together is a portion 6, which is also referred to as a "sealing portion". A wick structure 8 is disposed on the inside surface of the second sheet 3 (i.e., the major surface facing the inside of the housing or otherwise called the "major inside surface"). Part of the surface of the wick structure 8 is joined and fixed to the major inside surface of the second sheet 3.

The housing 4 has a tabular shape. Here, the term "tabular shape" may include a shape like a panel or a shape like a sheet, in other words, a shape having the length and the width substantially greater than the height (thickness), for example, 10 or more times greater than the thickness, or preferably 100 or more times greater than the thickness.

The housing 4 is constituted by the first sheet 2 and the second sheet 3 that oppose each other.

The size of the housing 4 is not specifically limited here. However, the thickness of the housing 4 (which is indicated by T in FIG. 1) may be preferably 100 µm to 600 µm, more preferably 200 µm to 500 µm. The length of the housing 4 (indicated by L in FIGS. 1 and 2) and the width of the housing 4 (indicated by W in FIG. 2) may be set appropriately in accordance with application purposes. For example, they may be 5 mm to 500 mm, 20 mm to 300 mm, or 50 mm to 200 mm.

The shape of the housing 4 is not specifically limited. For example, the shape of the housing 4 in a plan view (the shape of the housing 4 as illustrated in FIG. 2, i.e., the shape as viewed from the top side of FIG. 1) may be a polygon such as a triangle or a rectangle, a circle, an oval, or a combination thereof.

The materials of the first sheet 2 and the second sheet 3 are not specifically limited insofar as they have characteristics appropriate for the vapor chamber, for example, thermal conductivity, strength, and flexibility. The materials of the first sheet 2 and the second sheet 3 may be preferably a metal, for example, copper, nickel, aluminum, magnesium, titan, iron, or an alloy including these metals as main ingredients. The material may be more preferably copper.

The first sheet 2 and the second sheet 3 may be made of the same material or of different materials. However, the first sheet 2 and the second sheet 3 may preferably be made of the same material.

The thickness of the first sheet 2 and the thickness of the second sheet 3 (indicated by t in FIG. 1) are not specifically limited but may be preferably 10 µm to 200 µm, more preferably 30 µm to 100 µm. For example, the thickness may be preferably 40 µm to 60 µm.

The first sheet 2 and the second sheet 3 are joined to each other at the peripheral portions thereof. The joining method is not specifically limited but may be, for example, laser welding, resistance welding, diffusion bonding, soldering, TIG arc welding (tungsten inert-gas arc welding), ultrasonic bonding, or plastic molding. Laser welding, resistance welding, or soldering may be preferably used for joining.

The pillars 5 support the first sheet 2 and the second sheet 3 from inside so as to maintain a predetermined distance therebetween. By disposing the pillars 5 inside the housing 4, deformation of the housing can be suppressed in such a case that the inside of the housing is depressurized or an external pressure is applied to the housing. Note that in the case of the pillars supporting the first sheet and the second sheet, the pillars may be directly in contact with each sheet or may support each sheet with other members, for example wick structures, interposed therebetween.

The material of the pillars 5 is not specifically limited but may be, for example, a metal, such as copper, nickel, aluminum, magnesium, titan, iron, or an alloy including these metals as main ingredients. The material may be preferably copper. In a preferred example, the material of the pillars may be the same as one or both of the materials of the first sheet and the second sheet.

The height of the pillars 5 may be set appropriately in accordance with a desired thickness of the vapor chamber. The height may be preferably 50 µm to 500 µm, more preferably 100 µm to 400 µm, even more preferably 100 µm to 200 µm. For example, the height may be 125 µm to 150 µm. Here, the height of the pillars is the height measured in the thickness direction of the vapor chamber (measured in the up-down direction in FIG. 1).

The shape of each pillar 5 is not specifically limited but may be formed into a circular column, a rectangular column, a truncated cone, or a truncated pyramid.

The thickness of each pillar 5 is not specifically limited insofar as it provides a strength enough to suppress deformation of housing of the vapor chamber. However, a circle equivalent diameter of cross section of each pillar 5 taken perpendicular to the vertical direction may be, for example, 100 µm to 2000 µm, preferably 300 µm to 1000 µm. Increasing the circle equivalent diameter of the pillar can better suppress the deformation of housing of the vapor chamber. On the other hand, decreasing the circle equivalent diameter of the pillar can provide a larger space in which the vapor of the working liquid moves.

The pattern of arranging the pillars 5 is not specifically limited but may be preferably an equidistant arrangement, in other words, a grid-like pattern in which, for example, pillars 5 are disposed on equidistant grid points. The equidistant arrangement of the pillars provides a uniform strength over the entire vapor chamber.

The pillars 5 may be formed integrally with the first sheet. Alternatively, the pillars 5 may be formed separately and fixed thereafter to the first sheet at predetermined positions.

The type of working liquid described above is not specifically limited insofar as it is subjected to gas-liquid phase transition in the environment inside the housing. For example, a material, such as water, an alcohol, or a chlorofluorocarbon substitute may be used. In an example, the working liquid is an aqueous compound, preferably water.

The type of the above-described wick structure 8 is not specifically limited insofar as the wick structure has a structure that enables the working liquid to move by capillary forces (otherwise may be referred to as a "capillary structure"). The capillary structure that generates capillary forces to cause the working liquid to move is not specifically limited but may be a known structure used in a known vapor chamber. For example, the capillary structure may encompass micro structures such as pores, grooves, or protrusions, in other words, for example, a pleated structure or a reticular structure. The wick structure 8 may be made, for example, of a mesh, a fabric, a non-woven fabric, or a porous film.

In an example, the wick structure 8 has irregularities on the major surfaces thereof and is constituted by a core material and a skin material. In a preferred example, the core material is a resin. In a preferred example, the skin material is a metal. In a more preferred example, the core material is a resin and the skin material is a metal. Using the core material made of a resin can provide the wick structure with flexibility. Using the skin material made of a metal can improve wettability of the working liquid and thereby increase the capillary force.

The wick structure 8 may have irregularities on a major surface. Here, the term "irregularities" on the major surface of the wick structure refers to a structure that if the major surface of the wick structure is laid over an ideally flat surface, only part of the major surface can be in contact with the flat surface and the other part is not in contact (for example, the other part of the major surface is 100 nm or more distant from the flat surface). For example, the irregularities may be pores, grooves, protrusions, or fibrous structures that are present on the major surface of the wick structure.

Figure 3:
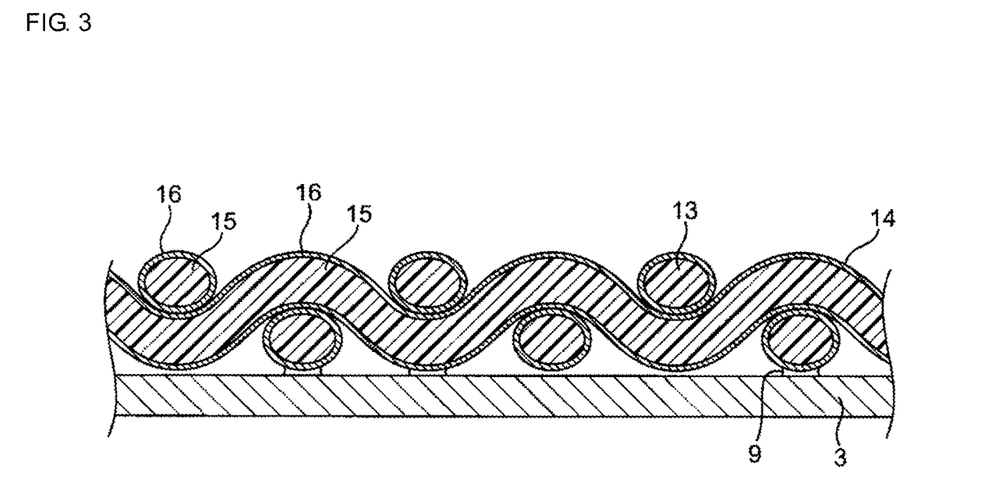
FIG. 3 is a cross-sectional view schematically illustrating a fibrous structure of wick structure of the vapor chamber according to an example of the present invention.
Figure 4:
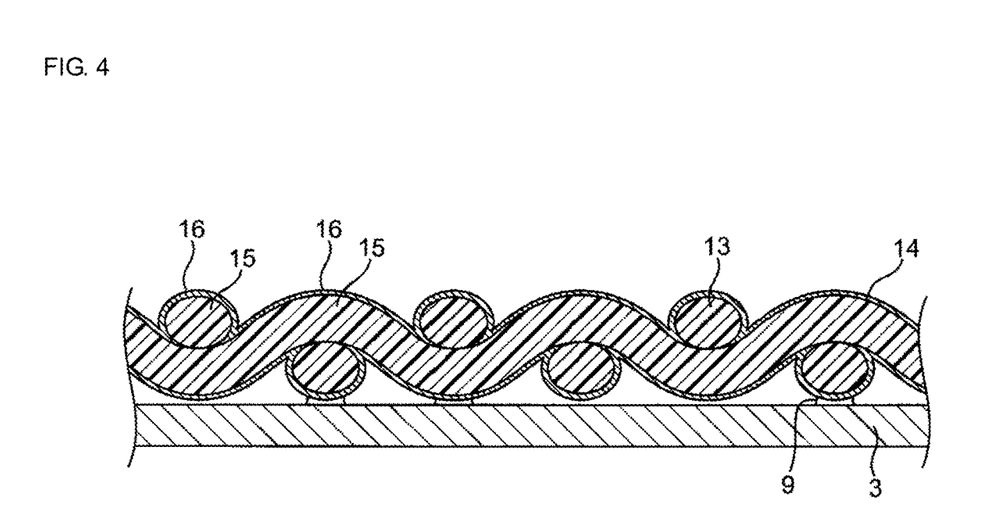
FIG. 4 is a cross-sectional view schematically illustrating a fibrous structure of wick structure of the vapor chamber according to an example of the present invention.

In an example, the wick structure 8 has a reticular structure. Here, the term "reticular structure" refers to such a structure that multiple points are connected by multiple lines. In the reticular structure, at least part of the multiple points and the multiple lines may constitute protrusions of the irregularities. In an example, the reticular structure may be a fibrous structure. The fibrous structure is a structure formed of multiple fibers, which includes a structure made of woven fibers (for example, a structure in which warp threads 13 and weft threads 14 are woven as illustrated in FIGS. 3 and 4) or a structure in which fibers are entangled with one another randomly.

The type of resin is not specifically limited but may be, for example, polyethylene, polyester, nylon, Teflon™, or urethane. In a preferred example, the resin may be polyethylene or polyester.

The metal described above is not specifically limited but may be, for example, copper, nickel, aluminum, magnesium, titan, iron, or an alloy including these metals as main ingredients. In a preferred example, the metal is copper, nickel, or an alloy thereof.

The skin material is present on the core material so as to cover the core material. The skin material may cover 50% or more of surface of the core material, preferably 70% or more, more preferably 90% or more, and even more preferably 98% or more. In a preferred example, the skin material covers substantially all the surface of the core material.

In an example, as illustrated in FIG. 3, the wick structure 8 has a structure into which warp threads 13 and weft threads 14 are woven. The core material 15 of each of the warp threads 13 and the weft threads 14 is totally covered by a skin material 16. In this example, the warp threads 13 and the weft threads 14 preferably can be in contact with each other but are not joined to each other.

In another example, as illustrated in FIG. 4, the wick structure 8 may have a structure into which the warp threads 13 and the weft threads 14 are woven and the core material 15 of the warp threads 13 is directly in contact with the core material 15 of the weft threads 14 at some or all of the intersections of the warp threads 13 and the weft threads 14. The skin material 16 may be present so as to cover the entire structure.

Plating, sputtering, vapor deposition, or impregnation may be used as a method of depositing the skin material on the core material. Plating is preferably used here.

In an example, the wick structure can be manufactured by weaving warp threads and weft threads that are made of a core material and subsequently by depositing the skin material thereon by plating. In another example, the wick structure can be manufactured by depositing the skin material on the core material and by weaving the warp threads and the weft threads that are made of the core material having the skin material thereon.

The thickness of the skin material is not specifically limited but may be preferably 0.01 μm to 10 μm, more preferably 0.1 μm to 5.0 μm, and even more preferably 0.5 μm to 3.0 μm.

The thickness of the wick structure 8 is not specifically limited but may be, for example, 5 μm to 200 μm, preferably 10 μm to 80 μm, and more preferably 30 μm to 50 μm.

The distance between an end of the wick structure 8 and a nearby sealing portion 6 is not specifically limited but may be, for example, 5000 μm or less, preferably 500 μm or less, more preferably 300 μm or less, even more preferably 100 μm or less. In a preferred example, the wick structure 8 is in contact with the sealing portion 6. Extending the wick structure as close to the sealing portion as possible causes the vapor chamber to have a larger effective area and improves the heat transport capacity.

The wick structure 8 is fixed to the major inside surface of the housing 4 (i.e., the major inside surface of the second sheet 3). The wick structure 8 is fixed by joining the major surface of the wick structure 8 to the major inside surface of the second sheet 3. Fixing the wick structure to the major inside surface of the housing prevents displacement of the wick structure. Fixing the wick structure suppresses the likelihood of the wick structure being displaced and pinched in the sealing portion when the first sheet and the second sheet are joined together, thereby enabling the wick structure to be disposed to a position closer to the sealing portion. In other words, this enables the use of a larger wick structure, which leads to an increase in heat transport capacity of the vapor chamber.

In joining the wick structure 8 to the second sheet 3, a portion of surface of the wick structure 8 is joined to a portion of major inside surface of the second sheet 3. Joining only a portion of surface of the wick structure and not joining the other portion thereof can create a space between the surface of the wick structure and the second sheet except for the joint portions, which enables such a space to retain the working liquid. Moreover, the working liquid retained in such a space is also subjected to capillary forces, which improves the heat transport capacity of the vapor chamber.

In the joint region between the wick structure and the housing, the proportion of total area of all the joint portions present in the joint region to the area of the joint region is 50% or less, preferably 30% or less, and more preferably 20% or less. In addition, in the joint region between the wick structure and the housing, the proportion of total area of all the joint portions present in the joint region to the area of the joint region is preferably 1% or more, more preferably 5% or more, even more preferably 10% or more, and still even more preferably 15% or more. Here, the term "joint region" refers to a region in which joint portions are present and distances between adjacent joint portions are 100 μm or less. In addition, the "joint region" is defined as a maximum region that can be obtained by connecting all the joint portions by straight lines (i.e., a region that can be obtained by connecting outermost joint portions). The "area of a joint portion" is defined as an area that a joint portion occupies on the major inside surface of the housing.

Typically in the known art, when the wick structure is joined to the housing, the area of the joint portions has tended to be made larger so as to fix the wick structure securely even when spot joining is adopted. In the present invention, however, the total area of the joint portions in the joint region is set at 50% or less of the area of the joint region, which creates a space in the joint region where the joint portions are not present. This space can retain the working liquid and generate capillary forces, which thereby improves the heat transport capacity of the entire vapor chamber.

The proportion of the total area of all the joint portions to the area of major surface of the wick structure may be preferably 0.1% to 30%, more preferably 1% to 20%, and even more preferably 5% to 15%. Setting the total area of all the joint portions in the range described above can sufficiently provide both the joint strength of the wick structure and the heat transport capacity of the vapor chamber.

In an example, the joint portions are present in a point-like manner on the major inside surface of the housing. Here, "to be present in a point-like manner" refers to a state in which multiple joint portions each occupying a small area are present so as to be spaced from each other. In other words, the wick structure 8 and the second sheet 3 are joined to each other at multiple points. In an example, the area of each joint portion may be preferably 1000 μm$^2$ or less, more preferably 100 μm$^2$ or less, and even more preferably 10 μm$^2$ or less. Forming the joint portions in a point-like manner can increase the capillary force.

The height of each joint portion is preferably 20 μm or less, more preferably 5 μm or less, and even more preferably 1 μm or less. Here, the "height of each joint portion" refers to the height from the major inside surface of the housing to the wick structure, the height being measured at a border of a region (i.e., the periphery of the joint portion) in which the joint portion is in contact with the major inside surface of the housing (for example, the height indicated by h in FIG. 5). Decreasing the height of the joint portion can increase the capillary force. In addition, decreasing the height of the joint portion can suppress the likelihood of the function of the wick structure being impaired by the joint portions.

Figure 5:
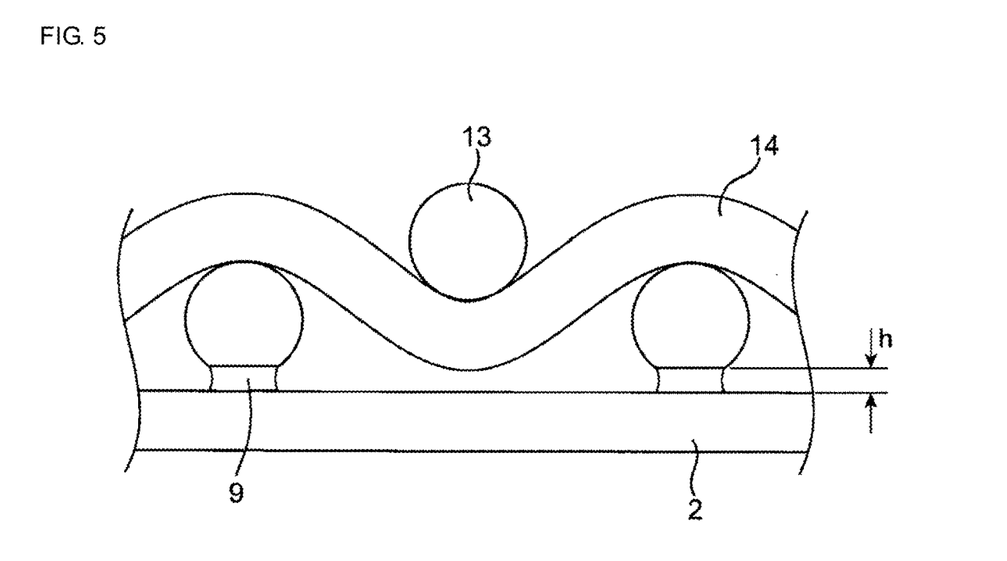
FIG. 5 is a cross-sectional view schematically illustrating joint portions between a major inside surface of a housing and the fibrous wick structure of the vapor chamber according to the present invention.

In an example, as illustrated in FIG. 5, in the case of the wick structure having a fibrous structure as in FIGS. 3 and 4, the wick structure is joined to the major inside surface of the housing 4 at contact points of the warp threads 13 or the weft threads 14 of the wick structure 8 being in contact with the major inside surface of the housing 4. All of the contact points need not be joined to the major inside surface of the housing 4 but any suitable contact points may be joined. As illustrated, the width of each joint portion 9 is preferably smaller than the thickness of each fiber.

In an example, the joint regions are present on only part of the major inside surface of the housing. The shape of each joint region is not specifically limited but may be shaped like a circle, an oval, a polygon such as a triangle, a quadrangle, or a pentagon, a line-like shape, or a combination thereof. The number of joint regions may be at least one, preferably two or more. The number of joint regions may be, for example, two to ten.

In an example, the joint regions are formed into substantially circular shapes. Forming the joint regions into circular shapes can suppress the likelihood of movement of the working liquid being impaired compared with the case in which the joint regions are shaped into polygons, for example, quadrangles or line-like shapes. This promotes smooth movement of the working liquid from the condensation section to the evaporation section, which improves the heat transport capacity of the vapor chamber.

In a preferred example, the joint regions are disposed so as to minimize blockage of a region between the evaporation section and the condensation section of the vapor chamber. For example, in the case of the joint region being shaped linearly, the joint region is disposed at an edge portion of the wick structure or disposed parallel to the direction of working liquid movement. This promotes smooth movement of the working liquid from the condensation section to the evaporation section, which improves the heat transport capacity of the vapor chamber.

In an example, the joint region may be disposed at an edge portion of the wick structure. Disposing the joint portion at the edge portion of the wick structure can suppress the likelihood of movement of the working liquid being impaired.

In a preferred example, the joint region is shaped substantially like a circle and disposed at an edge portion of the wick structure.

Figure 6A:
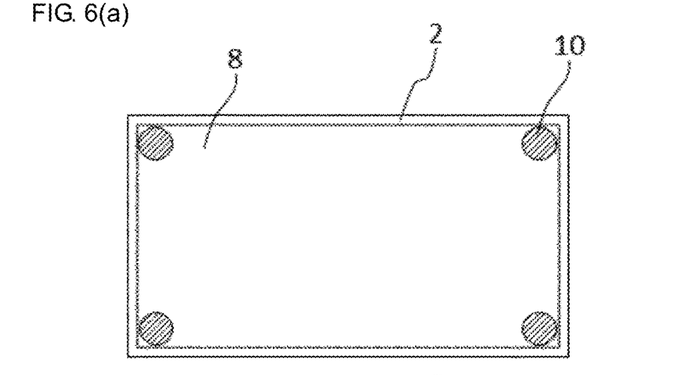
FIGS. 6(a) to 6(c) are views to be used for explaining joint regions of the vapor chamber according to the present invention.
Figure 6B:
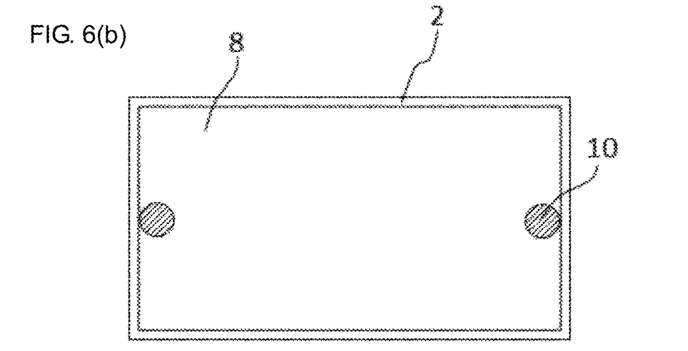
Figure 6C:
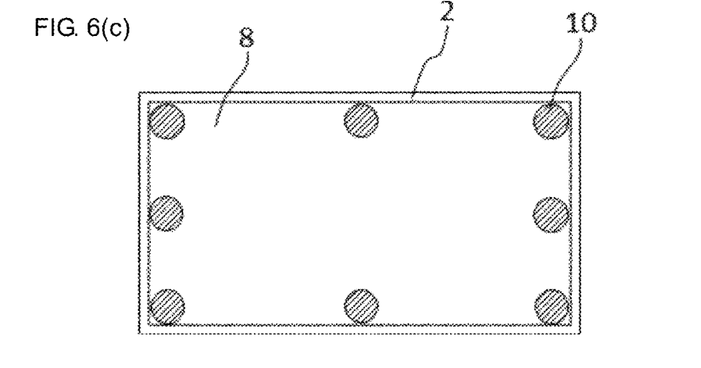
Figure 7A:
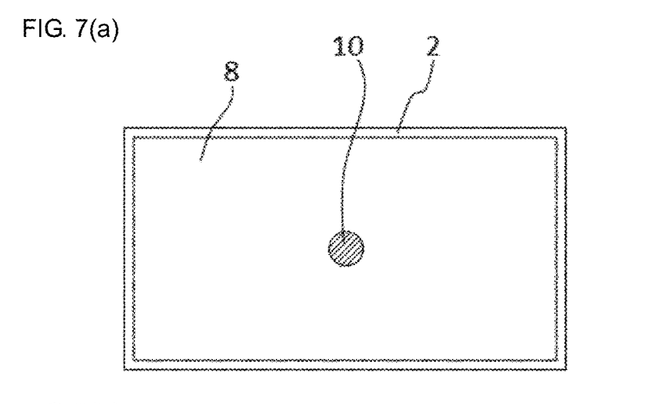
FIGS. 7(a) and 7(b) are views to be used for explaining joint regions of the vapor chamber according to the present invention.
Figure 7B:
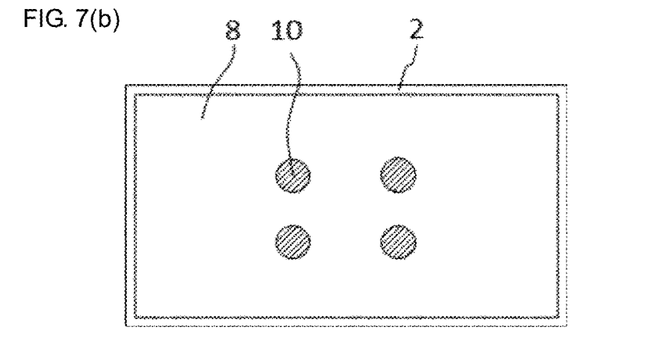
Figure 8A:
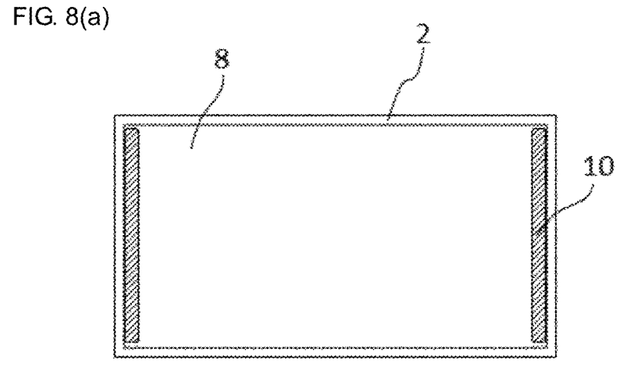
FIGS. 8(a) and 8(b) are views to be used for explaining joint regions of the vapor chamber according to the present invention.
Figure 8B:
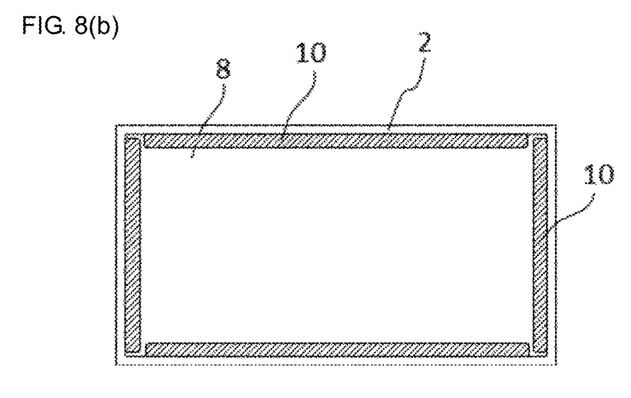
Figure 9A:
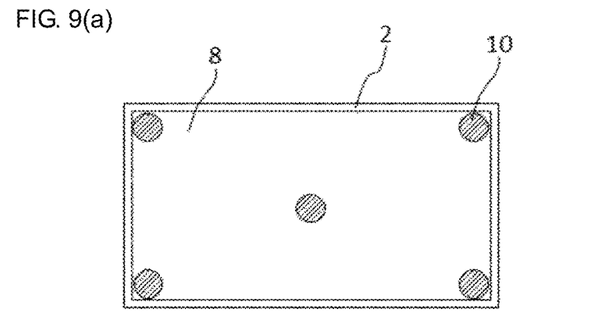
FIGS. 9(a) to 9(d) are views to be used for explaining joint regions of the vapor chamber according to the present invention.
Figure 9B:
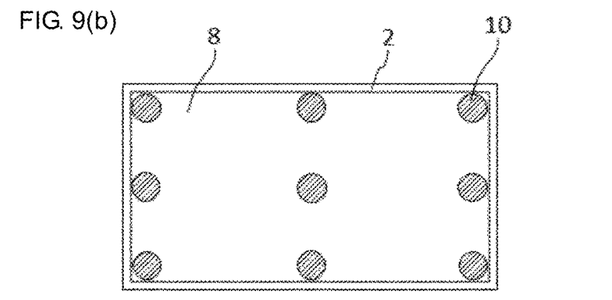
Figure 9C:
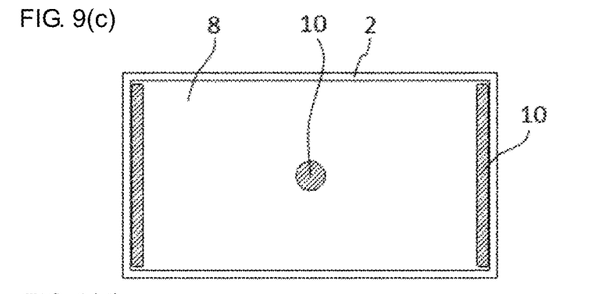
Figure 9D:
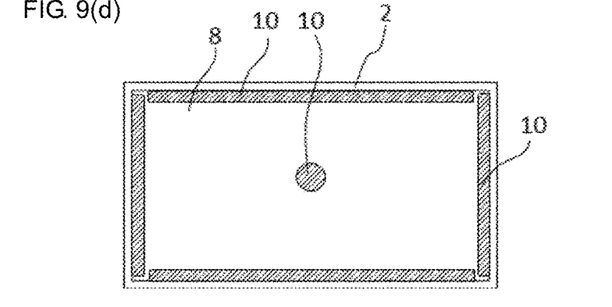

In an example, joint regions 10 may be disposed at edge portions of the wick structure. For example, the joint regions 10 may be disposed near four corners (FIG. 6(a)), or near respective centers on opposing sides (FIG. 6(b)), or near four corners and the center on each side (FIG. 6(c)). In another example, joint regions 10 may be disposed near the center of the wick structure. For example, one joint region 10 is disposed at a central region (FIG. 7(a)). Alternatively, four joint regions 10 may be disposed symmetrically in the central region (FIG. 7(b)). In another example, the joint regions 10 may be shaped linearly and disposed near two opposing sides (FIG. 8(a)) of the wick structure or disposed near four sides (FIG. 8(b)) thereof. In another example, the joint regions 10 may be disposed by combining the above arrangements. For example, the joint regions 10 may be disposed near four corners and the center of the wick structure (FIG. 9(a)), or may be disposed near four corners, the center on each side, and the center of the wick structure (FIG. 9(b)), or may be disposed linearly near the two opposing sides and circularly near the center of the wick structure (FIG. 9(c)), or may be disposed linearly near the four sides and circularly near the center of the wick structure (FIG. 9(d)).

The wick structure 8 is joined to the major inside surface of the housing 4 (second sheet 3) preferably by resistance welding. In other words, the joint portions between the wick structure and the major inside surface of the housing are formed by resistance welding. By using resistance welding, the wick structure can be joined to the major inside surface only at contact points therebetween. This makes it easy to control the position, the size, and the height of joint portions as well as the number of joint portions.

Accordingly, the present invention also provides a method of manufacturing a vapor chamber that includes a tabular shaped housing, a wick structure disposed inside the housing, and a working liquid enclosed inside the housing, the method including disposing the wick structure on a major inside surface of the housing and fixing the wick structure by resistance welding.

The vapor chamber according to the present invention has been explained by describing the above embodiment. However, the vapor chamber according to the present invention is not limited to the examples illustrated in the drawings but may be subjected to various modifications.

For example, a vapor chamber of another example may further include a wick structure disposed also on the major inside surface of the first sheet 2.

In addition, protrusions, recesses, grooves, or the like may be formed on the major inside surface of the housing, for example, on one or both of respective major inside surfaces of the first sheet 2 and the second sheet 3.

The vapor chamber according to the present invention has a high heat transport capacity and can be preferably applied to heat radiation devices.

Accordingly, the present invention also provides a heat radiation device that includes the vapor chamber according to the present invention.

The vapor chamber according to the present invention is advantageous for size reduction and can be preferably used in devices, for example, electronic devices, of which the size reduction is demanded.

Accordingly, the present invention also provides an electronic device that includes the vapor chamber of the present invention or the heat radiation device of the present invention.

The vapor chamber according to the present invention has a high heat transport capacity and accordingly can be applied to a wide variety of applications. The vapor chamber can be used as, for example, a cooling device for an electronic device or the like and can be applied to applications where a small-size device capable of efficient heat transport is demanded.

REFERENCE SIGNS LIST 1 vapor chamber
2 first sheet
3 second sheet
4 housing
5 pillar
6 sealing portion
7 protrusion
8 wick structure
9 joint portion
10 joint region
11 central region
12 end region
13 warp thread
14 weft thread
15 core material
16 skin material

The invention claimed is:
1. A vapor chamber comprising:
a housing;
a wick structure joined to a major inside surface of the housing, wherein the wick structure is joined to the inside surface of the housing at a plurality of joint portions within a joint region, and a proportion of a total area of the plurality of joint portions within the joint region to an area of the joint region is 50% or less; and
a working liquid enclosed inside the housing.

2. The vapor chamber according to claim 1, wherein a proportion of the total area of the joint region to an area of a major surface of the wick structure is 30% or less.

3. The vapor chamber according to claim 1, wherein the wick structure includes a core material made of a resin and a skin material made of a metal.

4. The vapor chamber according to claim 1, wherein the wick structure has a reticular structure.

5. The vapor chamber according to claim 1, wherein the wick structure has a copper-plating layer.

6. The vapor chamber according to claim 1, wherein the joint region is disposed at an edge portion of the wick structure.

7. The vapor chamber according to claim 1, wherein the joint region has a circular shape and is disposed at an edge portion of the wick structure.

8. The vapor chamber according to claim 1, wherein the plurality of joint portions between the wick structure and a major inside surface of the housing is a resistance welded plurality of joint portions.

9. A heat radiation device comprising the vapor chamber according to claim 1.

10. An electronic device comprising the vapor chamber according to claim 1.

11. A method of manufacturing a vapor chamber, the method comprising:
disposing a wick structure on a major inside surface of a housing; and
fixing the wick structure to the major inside surface of the housing by resistance welding,
wherein the wick structure is fixed to the inside surface of the housing at a plurality of joint portions within a joint region, and a proportion of a total area of the plurality of joint portions within the joint region to an area of the joint region is 50% or less.

12. The method of manufacturing a vapor chamber according to claim 11, further comprising enclosing a working liquid inside the housing.

13. The method of manufacturing a vapor chamber according to claim 11, wherein a proportion of the total area of the joint region to an area of a major surface of the wick structure is 30% or less.

14. The method of manufacturing a vapor chamber according to claim 11, wherein the wick structure includes a core material made of a resin and a skin material made of a metal.

15. The method of manufacturing a vapor chamber according to claim 11, wherein the wick structure has a reticular structure.

16. The method of manufacturing a vapor chamber according to claim 11, wherein the wick structure has a copper-plating layer.

17. The method of manufacturing a vapor chamber according to claim 11, wherein the joint region is disposed at an edge portion of the wick structure.

18. The method of manufacturing a vapor chamber according to claim 11, wherein the joint region has a circular shape and is disposed at an edge portion of the wick structure.

* * * * *